United States Patent
Woo et al.

(10) Patent No.: US 6,455,413 B1
(45) Date of Patent: Sep. 24, 2002

(54) PRE-FILL CMP AND ELECTROPLATING METHOD FOR INTEGRATED CIRCUITS

(75) Inventors: Christy Mei-Chu Woo, Cupertino; Minh Quoc Tran, Milpitas, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/894,525

(22) Filed: Jun. 27, 2001

(51) Int. Cl.[7] .......................................... H01L 21/4763
(52) U.S. Cl. ...................... 438/626; 438/627; 438/637; 438/643; 438/648; 438/687
(58) Field of Search ................................. 438/626, 627, 438/633, 637, 643, 645, 648, 687

(56) References Cited

U.S. PATENT DOCUMENTS

| | | | | |
|---|---|---|---|---|
| 5,897,368 A | * | 4/1999 | Cole, Jr. et al. | 438/625 |
| 5,898,222 A | * | 4/1999 | Farooq et al. | 257/762 |
| 6,037,258 A | * | 3/2000 | Liu et al. | 438/687 |
| 6,136,707 A | * | 10/2000 | Cohen | 438/687 |
| 6,146,517 A | * | 11/2000 | Hoinkis | 205/186 |
| 6,150,723 A | * | 11/2000 | Harper et al. | 257/762 |
| 6,187,670 B1 | * | 2/2001 | Brown et al. | 438/638 |
| 6,277,728 B1 | * | 8/2001 | Ahn et al. | 438/619 |
| 6,368,484 B1 | * | 4/2002 | Volant et al. | 205/220 |
| 2001/0029157 A1 | * | 10/2001 | Chopra | 451/57 |
| 2002/0033342 A1 | * | 3/2002 | Uzoh et al. | 205/118 |

FOREIGN PATENT DOCUMENTS

TW          396568 A    *   7/2000    ........... H01L/23/50

OTHER PUBLICATIONS

S. Kondo et al., "Complete Abrasive–Free Process for Copper Damascence Interconnection," Proceedings of IEEE 2000 International Interconnect Technology Conference, Jun. 2000, pp. 253–255.*

* cited by examiner

Primary Examiner—Olik Chaudhuri
Assistant Examiner—Stephen W. Smoot
(74) Attorney, Agent, or Firm—Mikio Ishimaru

(57) ABSTRACT

A manufacturing method for an integrated circuit is provided having a semiconductor substrate with a semiconductor device. A device dielectric layer is formed on the semiconductor substrate. A channel dielectric layer on the device dielectric layer has an opening formed therein. A barrier layer lines the channel opening. A seed layer is deposited over the barrier layer. The seed and barrier layers are then removed above the channel dielectric layer. A second seed layer is deposited over the semiconductor substrate. A conductor layer is electroplated over the second seed layer to fill the opening. The electroplated conductor layer and the second seed layer are removed above the channel dielectric layer.

16 Claims, 3 Drawing Sheets

PRE-FILL CMP AND ELECTROPLATING METHOD FOR INTEGRATED CIRCUITS

CROSS-REFERENCE TO RELATED APPLICATION(S)

The present application contains subject matter related to a concurrently filed U.S. Patent Application by Minh Quoc Tran and Christy Mei-Chu Woo entitled "PRE-FILL CMP AND ELECTROLESS PLATING METHOD FOR INTEGRATED CIRCUITS", identified by U.S. patent application Ser. No. 09/894,170 filed on Jun. 27, 2001, and commonly assigned to Advanced Micro Devices, Inc.

TECHNICAL FIELD

The present invention relates generally to integrated circuits and more particularly to controlling interconnect channel thickness therein.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two interconnect channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to lo the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

The via formation of the dual damascene process starts with the deposition of a thin via stop layer over the first channels and the first channel dielectric layer. The via stop layer to is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then As subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One of the major problems encountered during the CMP process is that, when the thick conductor material and the barrier layer are polished away, both the channels and dielectric layers are subject to "erosion", or undesirable CMP of the channel and dielectric materials, which makes it difficult to control the channel thickness.

Another major problem, during the same process, wide channels are subject to "dishing", or undesirable CMP of the conductor material, which also makes it difficult to control the channel thickness.

Variable thickness channels are subject to increased resistance and shorter time to failure.

Solutions to these problems have been long sought but have long eluded those skilled in the art.

DISCLOSURE OF THE INVENTION

The present invention provides a method for manufacturing an integrated circuit having a semiconductor substrate with a semiconductor device. A device dielectric layer is formed on the semiconductor substrate and a channel dielectric layer with an opening is formed on the device dielectric layer. A barrier layer is deposited to line the channel opening and a seed layer is deposited over the barrier layer. The seed and barrier layers are removed above the channel dielectric layer and a second seed layer is deposited over the semiconductor substrate. A conductor layer is electroplated over the second seed layer to fill the opening. The electroplated conductor layer and the second seed layer are removed above the dielectric layer. This results in erosion and dishing being eliminated, and uniform channels being produced without the drawbacks of increased resistance and shorter time to failure.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
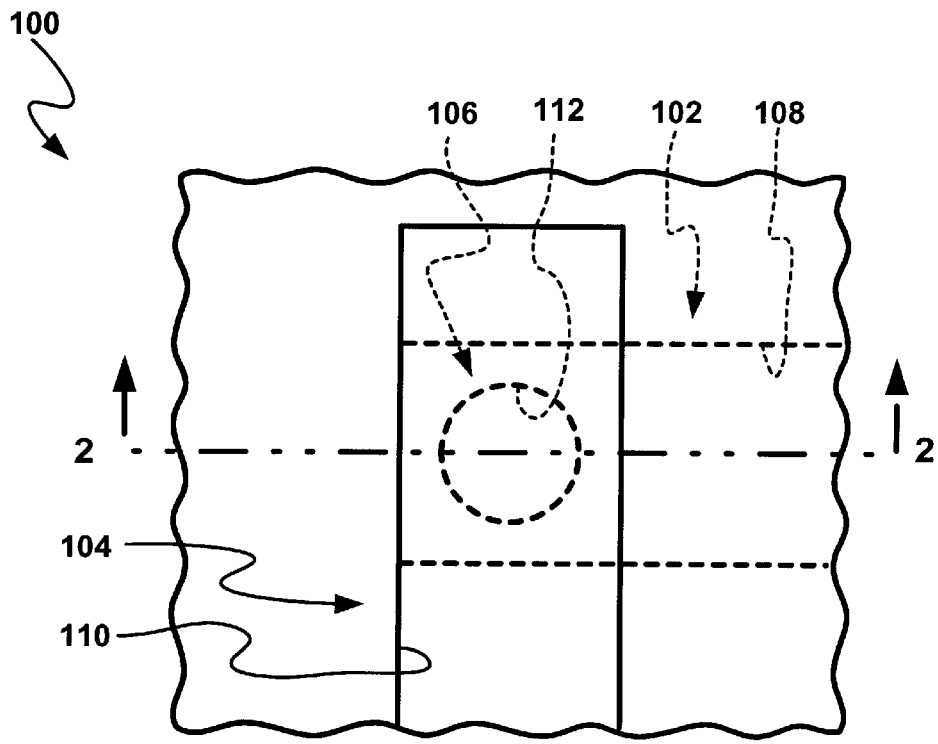
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
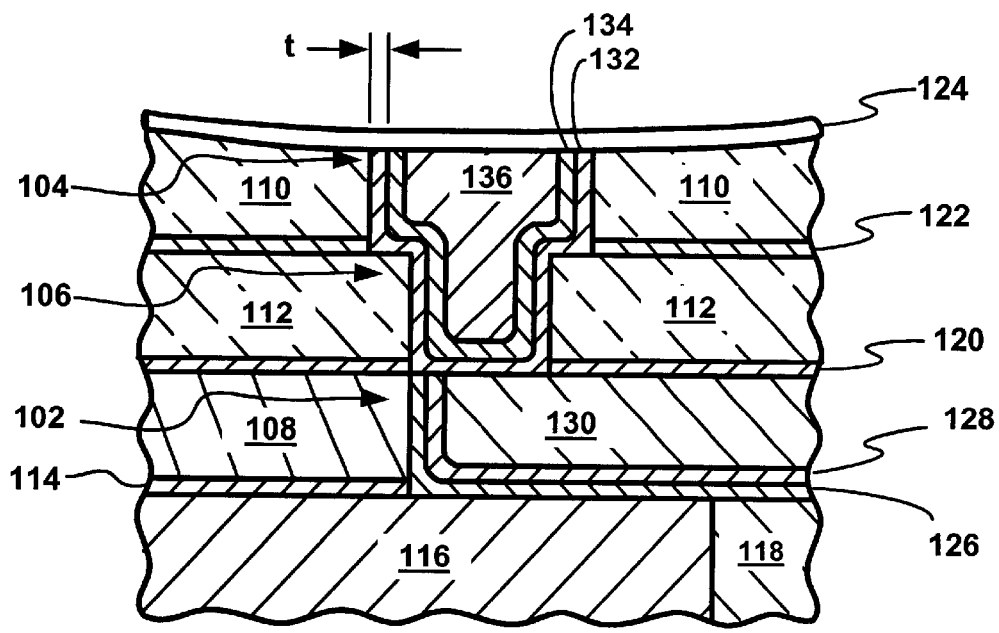
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

In the past, for copper conductor material and seed layers, highly resistive diffusion barrier materials such as tantalum nitride (TaN), titanium nitride (TiN), or tungsten nitride (WN) are used as barrier materials to prevent diffusion.

Figure 3:
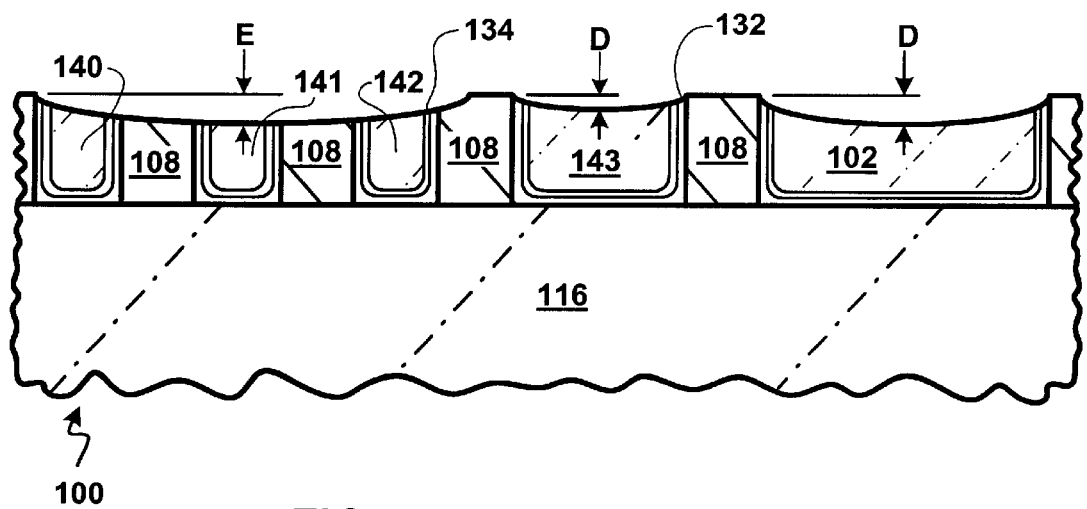
FIG. 3 (PRIOR ART) shows a step in the chemical-mechanical polishing process and depicts the channel erosion and dishing.

Referring now to FIG. 3 (PRIOR ART), therein is shown a step in the CMP process in which a first channel surface of the semiconductor wafer 100 is planarized. Therein is thus shown the planarization of the first channel 102, other channels 140 through 143, and the first channel dielectric layer 108 with a conventional CMP slurry containing abrasive particles. There are a number of different slurries known which consist of sized abrasive particles carried by a CMP solution.

Without tight process controls, the CMP will remove both the conductor material, such as copper, the barrier material, such as tantalum nitride, as well as the dielectric material, such as silicon oxide, and cause erosion "E". The erosion "E" is the formation of a concave depression in the other channels 140 through 142 and the first channel dielectric layer 108. Dishing "D" is the formation of concave depressions in the wider or longer channel 143 and he first channel 102, which is also due to the low chemical selectivity. Both erosion and dishing can dramatically change the thickness of the channels and reduce their current-carrying capability.

Figure 4:
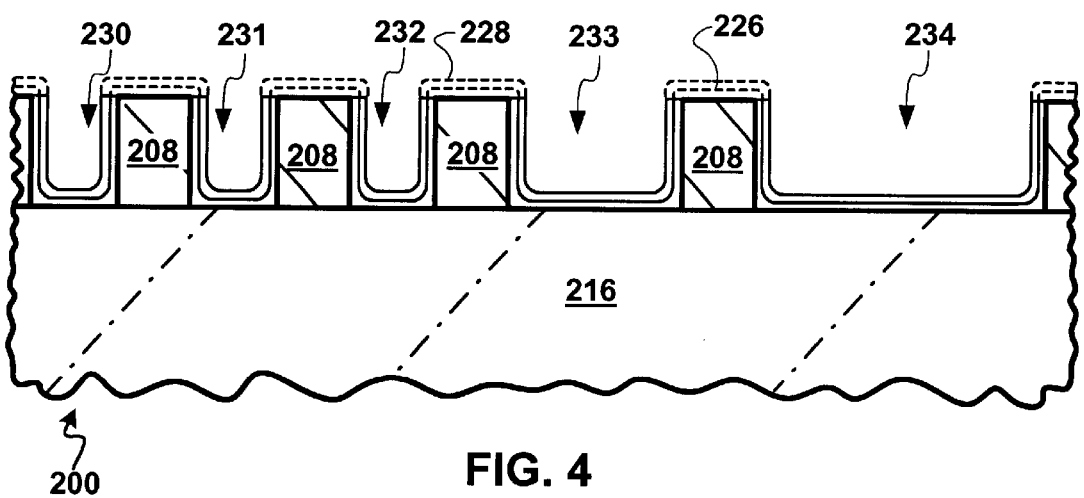
FIG. 4 shows a cross-section of a semiconductor wafer in a step in the chemical-mechanical polishing process in accordance with the present invention.

Referring now to FIG. 4, therein is shown a semiconductor wafer in an intermediate stage of manufacture in accordance with the present invention. A device dielectric layer 216 has been deposited as part of a semiconductor wafer 200.

A first channel dielectric layer 208 has been deposited, patterned, developed, and etched to form channel openings 230 through 234. The device dielectric layer 216 and the first channel dielectric 208 have been lined with a barrier layer 226 and a seed layer 228.

As indicated by dotted lines in FIG. 4, the portions of the barrier layer 226 and the seed layer 228 above the first channel dielectric layer 208 has been removed by a chemical-mechanical polishing process. An abrasiveless chemical is used for the chemical-mechanical polishing process in order to prevent abrasives from being left in the channel openings 230 through 234.

Figure 5:
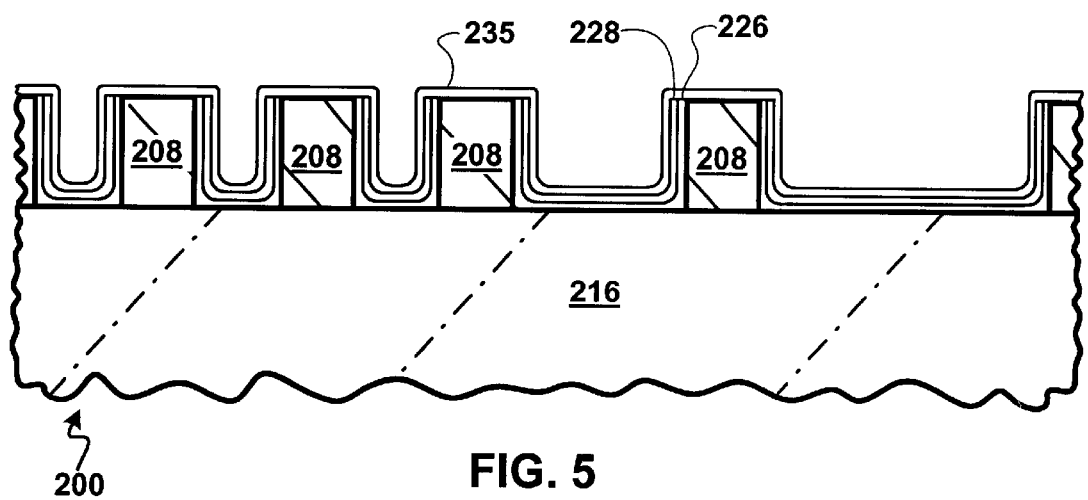
FIG. 5 is the structure of FIG. 4 after deposition of a second seed layer in accordance with the present invention.

Referring now to FIG. 5, therein is shown the semiconductor wafer 200 after a deposition of a second seed layer 235 in accordance with the present invention.

Figure 6:
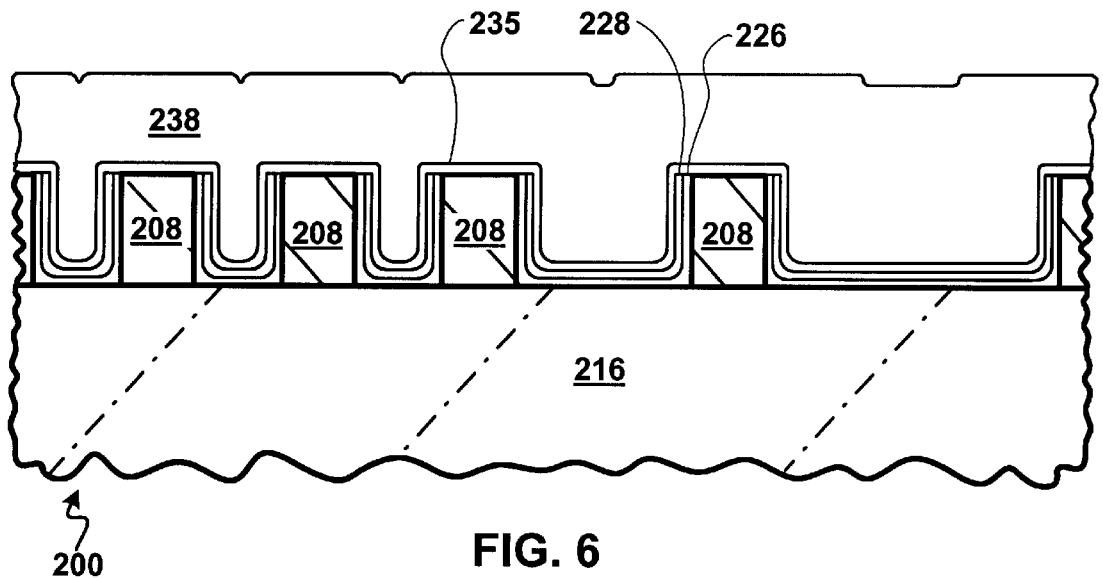
FIG. 6 is the structure of FIG. 5 with an electroplated conductor layer in accordance with the present invention.

Referring now to FIG. 6, therein is shown the semiconductor wafer 200 with an electroplated conductor layer 238. The second seed layer 235 acts as the electrode for the plating of the electroplated conductor layer 238 in an electroplating process.

Figure 7:
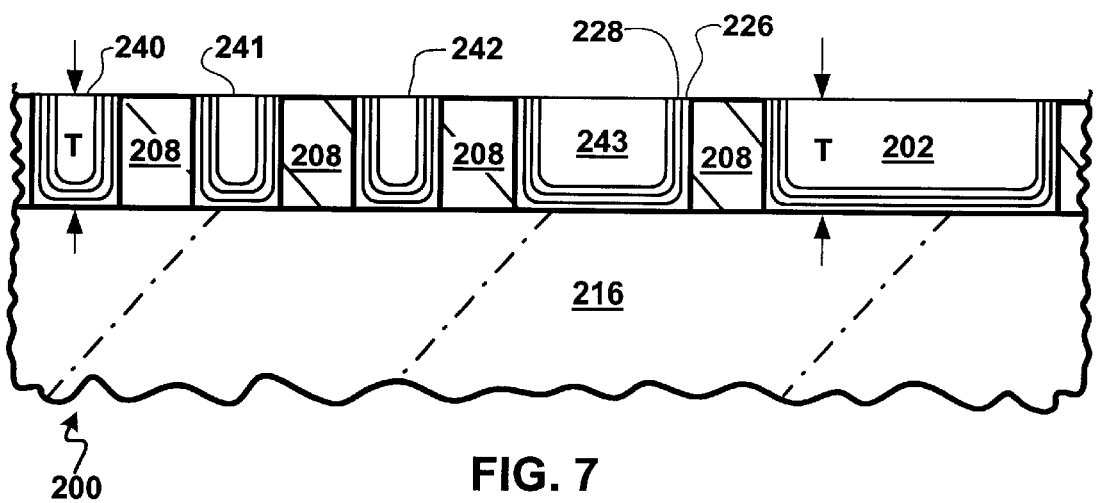
FIG. 7 is the structure of FIG. 6 with a uniform channel thickness in accordance with the present invention.

Referring now to FIG. 7, therein is shown the structure of FIG. 6 after CMP of the electroplated conductor layer 238 and the second seed layer 235 to be co-planar with the first channel dielectric layer 208 to form the interconnect conductor channels 240 through 243 and the first channel 202. Since the second seed layer 235 adheres poorly to the first channel dielectric layer 208 as compared to adhesion to the barrier layer 226, the electroplated conductor layer 238 and the second seed layer 235 are easily removed by the conductor CMP without removing the first channel dielectric layer 208.

This process results in less over-polishing with less dishing and erosion, which leads to the channels having uniform thicknesses "T".

In various embodiments, the diffusion barrier layers are of materials such as tantalum (Ta), titanium (Ti), tungsten (W), alloys thereof, and compounds thereof. The seed layers (where used) are of materials such as copper (Cu), gold (Au), silver (Ag), alloys thereof and compounds thereof with one or more of the above elements. The conductor cores with or without seed layers are of conductor materials such as copper, aluminum (Al), gold, silver, alloys thereof, and compounds thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), TMOS (tetramethoxysilane), OMCTS (octamethylcyclotetrasiloxane), HMDS (hexamethyldisiloxane), SOB (trimethylsilil borxle), DADBS (diaceloxyditerliarybutoxsilane), SOP (trimethylsilil phosphate), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. A method of manufacturing an integrated circuit comprising:

providing a semiconductor substrate having a semiconductor device provided thereon;

forming a dielectric layer over the semiconductor substrate;

forming an opening in the dielectric layer;

depositing a barrier layer to line the opening;

depositing a seed layer over the barrier layer;

removing the seed layer and barrier layer above the dielectric layer;

depositing a second seed layer over the seed layer and the dielectric layer;

depositing a conductor core over the second seed layer by electroplating to fill the opening and connect to the semiconductor device wherein removing the seed layer and barrier layer are performed before depositing the conductor core; and removing the conductor core and the second seed layer above the dielectric layer.

2. The method of manufacturing an integrated circuit as claimed in claim 1 wherein removing the seed layer and barrier layer uses an abrasiveless removal process.

3. The method of manufacturing an integrated circuit is claimed in claim 1 wherein removing the conductor core and the second seed layer uses a chemical-mechanical polishing process.

4. The method of manufacturing an integrated circuit as claimed in claim 1 wherein forming the dielectric layer deposits a material having a dielectric constant under 3.9.

5. The method of manufacturing an integrated circuit as claimed in claim 1 wherein depositing the barrier layer deposits a material selected from a group consisting of tantalum, titanium, tungsten, an alloy thereof, and a compound thereof.

6. The method of manufacturing an integrated circuit as claimed in claim 1 wherein depositing the second seed layer deposits a material selected from a group consisting of copper, gold, silver, an alloy thereof, and a compound thereof.

7. The method of manufacturing an integrated circuit as claimed in claim 1 wherein depositing the seed layer deposits a material selected from a group consisting of copper, gold, silver, an alloy thereof, and a compound thereof.

8. The method of manufacturing an integrated circuit as claimed in claim 1 wherein depositing the conductor core deposits material selected from a group consisting of copper, gold, silver, an alloy thereof, and a compound thereof.

9. A method of manufacturing an integrated circuit comprising: providing a semiconductor substrate having a semiconductor device provided thereon; providing a device dielectric layer over the semiconductor substrate;

forming a channel dielectric layer over the device dielectric layer;

forming an opening in the channel dielectric layer;

depositing a barrier layer to line the opening;

depositing a seed layer over the barrier layer;

removing the seed layer and barrier layer above the channel dielectric layer by chemical-mechanical polishing;

depositing a second seed layer over the seed layer and the channel dielectric layer, depositing a conductor core over the second seed layer by electroplating to fill the opening and connect to the semiconductor device wherein removing the seed layer and barrier layer are performed before depositing the conductor core; and removing the conductor core and the second seed layer above the channel dielectric layer by chemical mechanical polishing.

10. The method of manufacturing an integrated circuit as claimed in claim 9 wherein removing the seed layer and the barrier layer by chemical-mechanical polishing uses an abrasiveless chemical-mechanical polishing solution.

11. The method of manufacturing an integrated circuit as claimed in claim 9 wherein forming the channel dielectric layer deposits a material having a dielectric constant under 3.9.

12. The method of manufacturing an integrated circuit as claimed in claim 9 wherein depositing the barrier layer deposits a material selected from a group consisting of tantalum, titanium tungste, an alloy thereof, and a compound thereof.

13. The method of manufacturing an integrated circuit as claimed in claim 9 wherein depositing the seed layer deposits a material selected from a group consisting of copper, gold, silver, an alloy thereof, and a compound thereof.

14. The method of manufacturing integrated circuit as claimed in claim 9 wherein depositing the second seed layer deposits a material selected from a group consisting of copper, gold, silver an alloy thereof, and a compound thereof.

15. The method of manufacturing an integrated circuit as claimed in claim 9 wherein depositing the conductor core deposits material selected from a group consisting of copper, gold, silver, an alloy thereof, and a compound thereof.

16. A method of manufacturing an integrated circuit comprising:

semiconductor substrate having a semiconductor device provided thereon;

providing a device dielectric layer over the semiconductor substrate;

forming a channel dielectric layer over the device dielectric layer, forming an opening in the channel dielectric layer;

depositing a barrier layer to line the opening;

depositing a seed layer over the barrier layer;

removing the seed layer above the channel dielectric layer by chemical-mechanical polishing;

depositing a second seed layer over the seed layer and the channel dielectric layer;

depositing a conductor core over the second seed layer by electroplating to fill the opening and connect to the semiconductor device wherein removing the seed layer is performed before depositing the conductor core; and removing the conductor core and the second seed layer above the channel dielectric layer by chemical mechanical polishing.

* * * * *

UNITED STATES PATENT AND TRADEMARK OFFICE
CERTIFICATE OF CORRECTION

PATENT NO.     : 6,455,413 B1
DATED          : September 24, 2002
INVENTOR(S)    : Woo et al.

It is certified that error appears in the above-identified patent and that said Letters Patent is hereby corrected as shown below:

Title page,
Item [54], delete "PRE-FILL CMP AND ELECTROPLATING METHOD FOR INTEGRATED CIRCUITS" and insert therefor -- INTEGRATED CIRCUIT MANUFACTURING METHOD INCLUDING SEED LAYER DEPOSITION, REMOVAL, AND SUBSEQUENT DEPOSITION --.

Column 1,
Line 59, delete "lo"

Column 2,
Line 39, delete the first occurrence of "to"
Line 48, delete "As"

Column 6,
Line 49, delete "is" and insert therefor -- as --

Column 7,
Line 39, delete "titanium tungste," and insert therefor -- titanium, tungsten, --

Column 8,
Line 5, insert therefor -- an -- before "integrated"
Line 8, insert therefor -- , -- after "silver"

Signed and Sealed this

Seventh Day of January, 2003

JAMES E. ROGAN
*Director of the United States Patent and Trademark Office*